United States Patent
Hasegawa

Patent Number: 5,972,800
Date of Patent: Oct. 26, 1999

[54] METHOD FOR FABRICATING A SEMICONDUCTOR DEVICE WITH MULTI-LEVEL STRUCTURED INSULATOR

[75] Inventor: Eiji Hasegawa, Tokyo, Japan

[73] Assignee: NEC Corporation, Tokyo, Japan

[21] Appl. No.: 08/890,312

[22] Filed: Jul. 9, 1997

Related U.S. Application Data

[62] Division of application No. 08/644,166, May 10, 1996.

[30] Foreign Application Priority Data

May 10, 1995 [JP] Japan ................................ 7/136169

[51] Int. Cl.$^6$ ................................................ H01L 21/316
[52] U.S. Cl. .......................... 438/761; 438/769; 438/775; 438/787; 438/791; 438/770
[58] Field of Search ...................... 438/761, 762, 438/769, 770–774, 775–777, 778, 787, 791, 786, 783–784, 756, 735, 737, 738, 743, 723, 695

[56] References Cited

U.S. PATENT DOCUMENTS

| | | |
|---|---|---|
| 3,668,004 | 6/1972 | Yamamoto et al. . |
| 4,045,594 | 8/1977 | Maddock . |

(List continued on next page.)

FOREIGN PATENT DOCUMENTS

| | | |
|---|---|---|
| 0617461 | 9/1994 | European Pat. Off. . |
| 60-28270 | 2/1985 | Japan . |
| 1125940 | 5/1989 | Japan . |
| 1185927 | 7/1989 | Japan . |
| 1-315141 | 12/1989 | Japan . |
| 2-18934 | 1/1990 | Japan . |
| 3-244125 | 10/1991 | Japan . |
| 5-75133 | 3/1993 | Japan . |
| 5-82777 | 4/1993 | Japan . |
| 5-151439 | 9/1993 | Japan . |
| 6-224416 | 8/1994 | Japan . |
| 6-302814 | 10/1994 | Japan . |

OTHER PUBLICATIONS

L. Manchanda et al., A Boron–Retarding and High Interface Quality Thin Gate Dielectric for Deep–Submicron Devices, *IEDM 93*, Dec. 5, 1993, pp. 459–462.

Bich–Yen Nguyen et al., "Scaling Limitation of Nitride Layer for Reliable Stacked Nitride/Oxide Gate Dielectrics", *Extended Abstracts*, vol. 90, No. 2, Jan. 1, 1990, pp. 457–458.

Seiichi Mori et al., "ONO Inter–Poly Dielectric Scaling for Nonvolatile Memory Applications", *IEEE Transctions on Electron Devices*, vol. 38, No. 2, Feb. 1991, pp. 386–391.

(List continued on next page.)

*Primary Examiner*—Charles Bowers
*Assistant Examiner*—Thanh Nguyen
*Attorney, Agent, or Firm*—Sughrue, Mion, Zinn, Macpeak & Seas, PLLC

[57] ABSTRACT

A method for fabricating a semiconductor device with a multi-level insulator formed on a semiconductor substrate is provided, which enables restraint of impurity atoms doped into a material contacted with the insulator from diffusing into the insulator and substrate. A first dielectric film formed on the substrate is made of an oxide of a semiconductor constituting the substrate by thermal treatment of the substrate in an oxygen atmosphere. The second dielectric film is disposed at the interface of the substrate and first dielectric and is made of a nitride or oxynitride of the semiconductor constituting the substrate by thermal treatment of the substrate and first dielectric in a nitride atmosphere. The insulator preferably contains only the first and second dielectric films to have a two-level structure. The insulator may further contain a third dielectric film formed over the multi-level structure, thereby having a three-level insulator structure.

9 Claims, 10 Drawing Sheets

U.S. PATENT DOCUMENTS

| | | |
|---|---|---|
| 4,051,273 | 9/1977 | Abbas et al. . |
| 4,080,619 | 3/1978 | Suzuki . |
| 4,408,387 | 10/1983 | Kiriseko . |
| 4,600,445 | 7/1986 | Horr et al. . |
| 4,621,277 | 11/1986 | Ito et al. .................................... 357/54 |
| 4,713,682 | 12/1987 | Erie et al. . |
| 5,187,636 | 2/1993 | Nakao . |
| 5,258,333 | 11/1993 | Shappir et al. .......................... 438/762 |
| 5,291,048 | 3/1994 | Nakao ..................................... 257/325 |
| 5,319,229 | 6/1994 | Shimoji et al. .......................... 257/324 |
| 5,319,230 | 6/1994 | Nakao ..................................... 257/325 |
| 5,376,593 | 12/1994 | Sandhu et al. ........................... 438/762 |
| 5,393,683 | 2/1995 | Mathews et al. . |
| 5,436,481 | 7/1995 | Egawa et al. ............................ 257/324 |
| 5,591,681 | 1/1997 | Wristers et al. ......................... 438/762 |
| 5,712,177 | 1/1998 | Kaushik et al. .......................... 438/762 |
| 5,745,428 | 4/1998 | Misawa et al. . |

OTHER PUBLICATIONS

Shiuh–Wuu Lee et al., "Circuit Performance of CMOS Technologies with Silicon Dioxide and Reoxidized Nitrided Oxide Gate Dielectrics", *IEEE Electron Device Letters*, vol. 11, No. 7, Jul. 1990, pp. 294–296.

Patent Abstracts of Japan, vol. 014, No. 117 (E0898), Mar. 5, 1990.

Patent Abstract of Japan, Publication No. 03–244125, dated Oct. 30, 1991.

Patent Abstract of Japan, Publication No. 05–251439, dated Sep. 28, 1993.

Korean Office Action dated Jan. 19, 1999.

T. Hori, et al., "Composition study of ultrathin rapidly reoxidized nitrided oxides," J. Appl. Phys. 65(2), Jan. 15, 1989, pp. 629–635.

H. Hwang, et al., "Electrical and Reliability Characteristics of Ultrathin Oxynitride Gate Dielectric Prepared by Rapid Thermal Processing in $N_2O$", 1990 IEEE, pp. 16.5.1–16.5.4.

Y. Okada et al., "Gate Oxynitride Grown in Nitric Oxide (NO)", 1994 Symposium on VLSI Technology Digest of Technical Papers, pp. 105–106.

A. Uchiyama., et al., "High Performance Dual–gate Sub–halfmicron CMOSFETs with 6 nm–thick Nitrided $SiO_2$ Films in an $N_2O$ Ambient", 1990 IEEE, pp. 16.6.1–16.6.4.

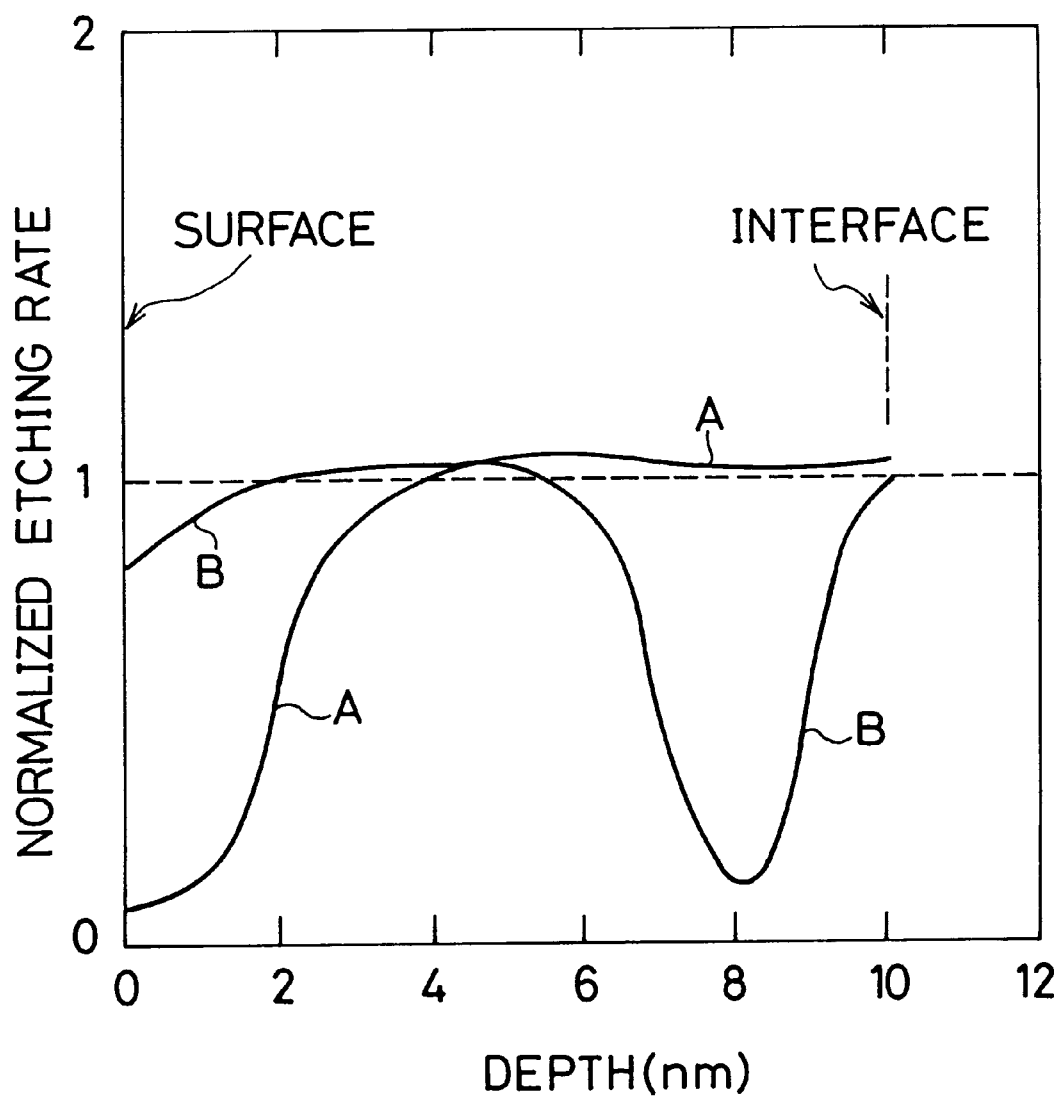

METHOD FOR FABRICATING A SEMICONDUCTOR DEVICE WITH MULTI-LEVEL STRUCTURED INSULATOR

This is a divisional of application Ser. No. 08/644,166 filed May 10, 1996.

BACKGROUND OF THE INVENTION

1. Field of the Invention

The present invention relates to a semiconductor device with a multi-level structured insulator formed on a semiconductor substrate and its fabrication method, which enables one to realize a reliable gate insulator of metal-oxide-semiconductor (MOS) type semiconductor devices.

2. Description of the Prior Art

With an MOS-type ultra-large-scale integrated circuit device (ULSI), it is well known that the property of a gate insulator of an MOS field-effect transistor (MOSFET) seriously affects the performance of the ULSI. Thus, the reliability improvement of the gate insulator has been an important problem and therefore, various formation methods of this insulator have been researched and developed.

Recently, in consideration with the fact that nitrided silicon dioxide (i.e., nitrided $SiO_2$) enables to avoid both the shift of the flatband voltage and the increase of the interfacial state density, which are caused by the hot carrier injection, the nitrided $SiO_2$ has been tried to be used for this purpose and has been considered as a promising material.

On the other hand, a $p^+$-type polysilicon film heavily doped with a p-type impurity such as boron (B) has been tried to be used as the gate electrode of the p-channel MOSFET (PMOSFET). The nitrided $SiO_2$ is capable of restraint of the doped impurity into the $p^+$-type polysilicon film from diffusing into the silicon substrate with which the nitrided $SiO_2$ is contacted and as a result, it has been considered as a promising material for this purpose, also.

A conventional fabrication method of a semiconductor device of this sort, which has a two-level structured insulator formed on a semiconductor substrate, was disclosed in the Japanese Non-Examined Patent Publication No. 2-18934 published in January 1990. A conventional semiconductor device fabricated using this conventional method is shown in FIG. 1. This conventional method will be explained below, which includes rapid thermal nitridation and rapid thermal annealing processes.

First, a semiconductor substrate 21 is thermally oxidized to thereby produce an oxide film 22 on a main surface of the substrate 21. The film 22 is made of an oxide of the semiconductor constituting the substrate 21.

Next, the substrate 21 with the oxide film 22 is subjected to a rapid thermal process using radiated heat in a nitriding atmosphere such as an $NH_3$ atmosphere, thereby nitriding the oxide film 22. Nitrogen (N) is introduced into the oxide film 22 during this process. Although the distribution of the introduced nitrogen in the film 22 varies dependent upon the nitridation temperature and nitridation time, almost all the introduced nitrogen exists in the neighborhood of the interface of the substrate 21 with the oxide film 22. Therefore, a nitrided oxide film 23 of the substrate semiconductor is produced near the substrate-oxide interface, as shown in FIG. 1.

Finally, the substrate 21 with the films 22 and 23 is subjected to a thermal annealing process using radiated heat in an inert atmosphere, thereby removing hydrogen (H) doped into the oxide film 22 during the prior nitridation process.

Thus, the conventional semiconductor device is obtained as shown in FIG. 1, which has a two-level structured insulator 27 made of the nitrided oxide film 23 formed on the substrate 21 and the oxide film 22 formed on the film 23. As shown in FIG. 1, the thickness of the nitrided oxide film 23 is much less than that of the oxide film 22.

Another conventional fabrication method of a semiconductor device of this sort, which has a three-level structured insulator formed on a semiconductor substrate, was disclosed in the article: Journal of Applied Physics, Vol. 65, No. 2, pp 629–635, Jan. 15, 1989, entitled "compositional Study of Ultrathin reoxidized nitrided oxides". This conventional method includes a thermal reoxidation process performed in an oxygen atmosphere instead of the hydrogen-removing thermal annealing process in the above conventional method of FIG. 1, which is shown in FIGS. 2A to 2D.

First, a semiconductor substrate 31 shown in FIG. 2A is thermally oxidized to thereby produce an oxide film 32 on a main surface of the substrate 31, as shown in FIG. 2B. The film 32 is made of an oxide of the semiconductor constituting the substrate 31.

Next, the substrate 31 with the film 32 is subjected to a thermal nitridation process in an $NH_3$ atmosphere, thereby nitriding the oxide film 32. Nitrogen is introduced into the oxide film 32 during this process and exists in the surface area of the film 32 and in the neighborhood of the interface of the substrate 31 with the oxide film 32. Therefore, upper and lower nitrided oxide films 33 and 34 of the substrate semiconductor are produced, as shown in FIG. 3C.

Thus, the three-level structure made of the lower nitrided oxide film 33 formed on the substrate 31, the oxide film 32 formed on the film 33, and the upper nitrided oxide film 34 formed on the film 32 is obtained.

The upper and lower nitrided oxide films 33 and 34 are quite different in microscopic structure from each other. The nitrogen atoms introduced into the lower film 33 are strongly bonded to the neighboring silicon (Si) and oxygen (O) atoms. This means that these nitrogen atoms and consequently, the lower film 33 is very stable.

On the other hand, the nitrogen atoms introduced into the upper film 34 tend to exist as interstitial and/or dangling atoms and therefore, they are unstable. This means that the upper film 34 also is unstable.

Finally, the substrate 31 with the three films 32, 33 and 34 is thermally reoxidized in an $O_2$ atmosphere. Since the nitrogen (N) atoms introduced into the upper nitrided oxide film 34 are unstable, not only the hydrogen (H) atoms but also the nitrogen atoms introduced into the upper film 34 during the prior nitridation process are removed outward. Thus, the upper nitrided oxide film 34 disappears in this process and as a result, the thickness of the oxide film 32 increases by a value equivalent to the thickness of the film 34.

On the other hand, since the nitrogen atoms introduced into the lower nitrided oxide film 33 are stable, only the hydrogen (H) atoms introduced into the lower film 33 are removed. Thus, the thickness of the lower nitrided oxide film 33 remains approximately unchanged through this process.

Further, during the reoxidation process, a thin oxide film 35 is produced at the interface of the substrate 31 with the lower nitrided oxide film 33 due to reoxidation of substrate 31.

Thus, the conventional semiconductor device having a three-level structured insulator 37 is obtained, as shown in FIG. 2D. This insulator 37 is composed of the oxide film 35 formed on the substrate 31, the reoxidized, nitrided oxide film 33 formed on the film 35, and the oxide film 32 formed on the film 33. As shown in FIG. 2D, the thickness of the nitrided oxide film 33 is much less than that of the upper oxide film 32.

In the above document disclosing the conventional semiconductor device shown in FIG. 2D, it was reported that the nitrogen atoms were distributed only in the neighborhood of the interface of the substrate 31 with the oxide film 35. This was due to the fact that the oxide film 35 was very thin and consequently, it could be said that only the lower nitrided oxide film 33 existed near the interface of the substrate 31.

As described earlier, the nitrided oxide film 23 or 33 serves as a diffusion or penetration barrier of the doped impurity atoms into the substrate 21 or 31. To realize this penetration-barrier function, it is not necessary to use a pure, uniform nitride film produced through a deposition process such as a low-pressure chemical vapor deposition (LPCVD). Any nitrogen-containing oxide film such as the nitrided oxide film 23 described above is capable of the function. It is sufficient for this function that this nitrogen-containing oxide film has a nitrogen concentration of several atomic percents and a thickness of approximately 1 to 2 nm.

This nitrogen-containing oxide film will restrain the doped impurity atoms from diffusing into the underlying semiconductor substrate through the nitrogen-containing film, and will facilitate the control of the threshold voltage of the MOSFET.

With the above conventional semiconductor devices, the nitrided oxide film 23 or 33 exists in the neighborhood of the interface of the substrate 21 or 31, in other words, the much thicker oxide film 22 or 32 than the nitrided oxide film 23 or 33 is located at the top of the insulator 27 or 37. As a result, when a material doped with an impurity (e.g., boron) is contacted with the insulator 27 or 37, a problem that the doped impurity atoms within the material tend to diffuse into the insulator 27 or 37 occurs. These doped impurity atoms will degrade its property and/or electrical performance.

This problem becomes serious when the insulator 27 or 37 is employed as a gate insulator of a MOSFET. Specifically, the degradation of the property and/or electrical performance of the insulator 27 or 37 will badly affect the performance or characteristics of the MOSFET, thereby deteriorating the fabrication yield and reliability of the MOS-type ULSI.

SUMMARY OF THE INVENTION

Accordingly, an object of the present invention is to provide a semiconductor device with a multi-level structured insulator and a fabrication method thereof that enables restraint of impurity atoms introduced into a material contacted with the insulator from diffusing into the insulator.

Another object of the present invention is to provide an MOS-type semiconductor device with a multi-level structured gate insulator and a fabrication method thereof that enables to restrain impurity atoms introduced into a gate electrode from diffusing into the gate insulator.

The above objects together with others not specifically mentioned will become clear to those skilled in the art from the following description.

According to a first aspect of the present invention, a semiconductor device is provided, which includes a semiconductor substrate, and a multi-level structured insulator formed on the substrate.

The insulator contains a first dielectric film formed on the substrate and a second dielectric film formed on the first dielectric film. The first dielectric film is thicker than the second dielectric film so that an interface of the first and second dielectric films exists at a level higher than the central level of the insulator.

The first dielectric film is made of an oxide of a semiconductor constituting the substrate. The second dielectric film is made of a nitride or oxynitride of the semiconductor constituting the substrate. The nitride is not limited to a pure nitride and it may contain a small amount of oxygen.

With the semiconductor device according to the first aspect of the invention, the first dielectric film located at a relatively lower level of the insulator has a greater thickness than that of the second dielectric film located at a relatively higher level thereof, so that the interface of the first and second dielectric films exists at a level higher than the central level of the insulator.

In other words, the second dielectric film serving as a diffusion or penetration barrier is positioned at or near the opposite side of the insulator to the substrate.

Therefore, when a material doped with impurity atoms is contacted with the opposite side of the insulator to the substrate, the diffusion action of the impurity atoms are stopped by the second dielectric film. This means that the introduction of the impurity atoms are limited within a small part of the insulator.

As a result, the degradation in the property and/or electrical performance of the insulator can be nearly or completely avoided.

If the insulator is used as a gate insulator of an MOSFET, the degradation in the property and/or electrical performance of the gate insulator can be nearly or completely avoided.

In the semiconductor device according to the first aspect of the invention, it is preferred that the thickness of the second dielectric film is in the range from 1 to 2 nm when the second dielectric film is made of a nitride. If the thickness of the second dielectric film is less than 1 nm, a satisfactory penetration-barrier function cannot be obtained. If it is greater than 2 nm, a satisfactory electric performance of the insulator film is difficult to be obtained.

It is preferred that the thickness of the second dielectric film is in the range from 2 to 4 nm when the second dielectric film is made of an oxynitride. If the thickness of the second dielectric film is less than 2 nm, a satisfactory penetration-barrier function cannot be obtained. If it is greater than 4 nm, a satisfactory electric performance of the insulator film is difficult to be obtained.

In a preferred embodiment of the semiconductor device according to the first aspect, the insulator contains only the first and second dielectric films to have a two-level structure. In this case, since the second dielectric film is located at the top of the insulator, the impurity atoms doped into the contacted material are ensured to be prevented from entering the insulator. As a result, the degradation in the property and/or electrical performance of the insulator can be completely avoided.

In another preferred embodiment of the semiconductor device according to the first aspect, the insulator further contains a third dielectric film formed on the second dielectric film, thereby having a three-level structure. The third dielectric film is made of an oxide of the semiconductor constituting the substrate.

In this case, since the third dielectric film is located at the top of the insulator and the second dielectric film serving as the penetration barrier is located between the third and first dielectric films, the impurity atoms doped into the contacted material may be introduced into the third dielectric film. However, the impurity atoms within the third dielectric film are ensured to be prevented from further progressing in the insulator by the neighboring second dielectric film. As a result, the degradation in the property and/or electrical performance of the insulator can be nearly avoided.

It is most preferred that the thickness of the third dielectric film is zero, in other words, the insulator contains no third dielectric film, since the introduction of the impurity atoms into the insulator can be completely prevented. However, the two-level structured insulator is very difficult to be realized through popular film-formation processes, because an oxide film (e.g., a native oxide film) tends to formed on the top of the second dielectric film at the time the second dielectric film has been made. Therefore, it is preferred that the thickness of the third dielectric film is as thin as possible.

A preferred value of the thickness of the third dielectric film is 3 nm or less. If the thickness is greater than 3 nm, the degradation in the property and/or electrical performance of the insulator is not restrained within an acceptable extent.

According to a second aspect of the present invention, a fabrication method of a semiconductor device is provided, which includes the following steps (a), (b) and (c):

(a) A first dielectric film is formed on a semiconductor substrate. The first dielectric film is made of an oxide of a semiconductor constituting the substrate.

(b) The substrate with the first dielectric film is subjected to a first heat-treatment in a nitriding atmosphere to nitride the first dielectric film, thereby producing a second dielectric film at an interface of the substrate with the first dielectric film. The second dielectric film is made of an oxynitride of the semiconductor constituting the substrate. The entire first dielectric film is nitrided to become the second dielectric film.

(c) The substrate with the second dielectric film is subjected to a second heat-treatment in an oxidizing atmosphere to oxide the substrate, thereby producing a third dielectric film at an interface of the substrate with the second dielectric film. The third dielectric film is made of an oxide of the semiconductor constituting the substrate.

The second and third dielectric films constitute a two-level structured insulator. The third dielectric film is thicker than the second dielectric film so that an interface of the third and second dielectric films exists at a level higher than the central level of the insulator.

With the fabrication method of a semiconductor device according to the second aspect of the invention, the third dielectric film formed on the substrate and the second dielectric film formed on the third dielectric film constitute a two-level structured insulator. Also, the third dielectric film is thicker than the second dielectric film so that an interface of the third and second dielectric films exists at a level higher than the central level of the insulator. This means that the semiconductor device fabricated by the method according to the second aspect has the same structure as that of the first embodiment.

As a result, this method can provide the semiconductor device according to the first aspect with a two-level structure.

In a preferred embodiment of the method according to the second aspect, the step (a) is performed by a thermal oxidation of the substrate in an oxidizing atmosphere to obtain the thickness of the first dielectric film of 2.5 nm or less. This limitation relating to the thickness is necessary to realize the nitridation of the entire first dielectric film during the step (b).

According to a third aspect of the present invention, another fabrication method of a semiconductor device is provided, which includes the following steps (a), (b) and (c):

(a) A first dielectric film is formed on a semiconductor substrate. The first dielectric film is made of an oxide of a semiconductor constituting the substrate.

(b) The substrate with the first dielectric film is subjected to a first heat-treatment in a nitriding atmosphere to nitride the first dielectric film, thereby producing a second dielectric film at an interface of the substrate with the first dielectric film. The second dielectric film is made of an oxynitride of the semiconductor constituting the substrate.

Unlike the method according to the second aspect, the first dielectric film does not disappear during this process.

(c) The substrate with the first and second dielectric film is subjected to a second heat-treatment in an oxidizing atmosphere to oxide the substrate, thereby producing a third dielectric film at an interface of the substrate with the second dielectric film. The third dielectric film is made of an oxide of the semiconductor constituting the substrate.

Different from the method according to the second aspect, the first, second and third dielectric films constitute a three-level structured insulator. The third dielectric film is thicker than the second dielectric film so that an interface of the third and second dielectric films exists at a level higher than the central level of the insulator.

With the fabrication method of a semiconductor device according to the third aspect of the invention, the third dielectric film formed on the substrate, the second dielectric film formed on the third dielectric film, and the first dielectric film formed on the second dielectric film constitute a three-level structured insulator. Also, the third dielectric film is thicker than the second dielectric film so that an interface of the third and second dielectric films exists at a level higher than the central level of the insulator. This means that the semiconductor device fabricated by the method according to the third aspect has the same structure as that of the first embodiment with the three-level structure.

As a result, this method can provide the semiconductor device according to the first aspect with a three-level structure.

In a preferred embodiment of the method according to the third aspect, the step (a) is performed by a thermal oxidation of the substrate in an oxidizing atmosphere to obtain the thickness of the first dielectric film of 5 nm or less. This limitation to the thickness of the first dielectric film is necessary to obtain the final thickness of the first dielectric film of 3 nm or less.

According to a fourth aspect of the present invention, still another fabrication method of a semiconductor device is provided, which includes the following steps (a) and (b):

This method is different from the methods according to the second and third aspects in that the step (a) of forming the first dielectric film on the substrate is not included.

(a) A semiconductor substrate is subjected to a first heat-treatment in a nitriding atmosphere to nitride the is substrate, thereby producing a first dielectric film, on a surface of the substrate. The first dielectric film is made of a nitride of a semiconductor constituting the substrate.

(b) The substrate with the first dielectric film is subjected to a second heat-treatment in an oxidizing atmosphere to oxide the substrate, thereby producing a second dielectric film at an interface of the substrate with the first dielectric film. The second dielectric film is made of an oxide of the semiconductor constituting the substrate.

The first and second dielectric films constitute a two-level structured insulator. The second dielectric film is thicker than the first dielectric film so that an interface of the second and first dielectric films exists at a level higher than the central level of the insulator.

The first dielectric film may contain oxygen because the entire surface of the first dielectric film is exposed to the oxidizing atmosphere during the step (b).

With the fabrication method of a semiconductor device according to the fourth aspect of the invention, the second dielectric film formed on the substrate and the first dielectric film formed on the second dielectric film constitute a two-level structured insulator. Also, the second dielectric film is thicker than the first dielectric film so that an interface of the second and first dielectric films exists at a level higher than a central level of the insulator. This means that the semiconductor device fabricated by the method according to the fourth aspect has the same structure as the device according to the first aspect with the two-level structured insulator.

As a result, this method can provide the semiconductor device according to the first aspect.

According to a fifth aspect of the present invention, a further fabrication method of a semiconductor device is provided, which includes the following steps (a), (b), (c) and (d):

This method is different from the methods according to the second to fourth aspects in that a step of etching the first dielectric film is additionally included.

(a) A first dielectric film is formed on a semiconductor substrate. The first dielectric film is made of an oxide of a semiconductor constituting the substrate.

(b) The substrate with the first dielectric film is subjected to a first heat-treatment in a nitriding atmosphere to nitride the first dielectric film, thereby producing a second dielectric film at an interface of the substrate with the first dielectric film. The second dielectric film is made of an oxynitride of the semiconductor constituting the substrate.

(c) The substrate with the first and second dielectric film is subjected to a second heat-treatment in an oxidizing atmosphere to oxide the substrate, thereby producing a third dielectric film at an interface of the substrate with the second dielectric film. The third dielectric film is made of an oxide of the semiconductor constituting the substrate.

(d) An opposite side of the first dielectric film to the substrate is etched until the thickness of the first dielectric film is equal to a specified value.

The first, second and third dielectric films constitute a three-level structured insulator. The third dielectric film is thicker than the second dielectric film so that an interface of the third and second dielectric films exists at a level higher than the central level of the insulator.

With the fabrication method of a semiconductor device according to the fifth aspect of the invention, the third dielectric film formed on the substrate, the second dielectric film formed on the third dielectric film, and the remaining first dielectric film formed on the second dielectric film constitute a three-level structured insulator. Also, the third dielectric film is thicker than the second dielectric film so that an interface of the third and second dielectric films exists at a level higher than the central level of the insulator. This means that the semiconductor device fabricated by the method according to the fifth aspect has the same structure as that of the first embodiment with the three-level structure.

As a result, this method can provide the semiconductor device according to the first aspect.

In the method according to the fifth aspect, since the first dielectric film is etched during the step (d), the first dielectric film may be thick, and the final thickness of the first dielectric film can be accurately controlled.

According to a sixth aspect of the present invention, a still further fabrication method of a semiconductor device is provided, which includes the same steps (a), (b) and (c) as shown in the method according to the fifth aspect. and the following step (d'):

(d') The first dielectric film is etched from its opposite side until the second dielectric film is exposed.

This method is different from the method according to the fifth aspect in that the entire first dielectric film is etched during the step (d').

The second and third dielectric films constitute a two-level structured insulator. The third dielectric film is thicker than the second dielectric film so that an interface of the third and second dielectric films exists at a level higher than the central level of the insulator.

With the fabrication method of a semiconductor device according to the sixth aspect of the invention, the third dielectric film formed on the substrate and the second dielectric film formed on the third dielectric film constitute a two-level structured insulator. Also, the third dielectric film is thicker than the second dielectric film so that an interface of the third and second dielectric films exists at a level higher than the central level of the insulator. This means that the semiconductor device fabricated by the method according to the fifth aspect has the same structure as that of the first embodiment with the two-level structure.

As a result, this method can provide the semiconductor device according to the first aspect with a two-level structure.

In the method according to the sixth aspect, since the entire first dielectric film is etched during the step (d'), the first dielectric film may be thicker than that in the method according to the second aspect.

BRIEF DESCRIPTION OF THE DRAWINGS

In order that the invention may be readily carried into effect, it will now be described with reference to the accompanying drawings.

FIG. 4 is a graph showing the relationship between the etching rate and depth of the insulator in the semiconductor device according to the first embodiment.

DETAILED DESCRIPTION OF THE PREFERRED EMBODIMENTS

Preferred embodiments of the present invention will be described in detail below while referring to FIGS. 3A to 11 attached.

FIRST EMBODIMENT

A fabrication method of a semiconductor device according to a first embodiment of the invention is shown in FIGS. 3A to 3D.

Figure 3A:
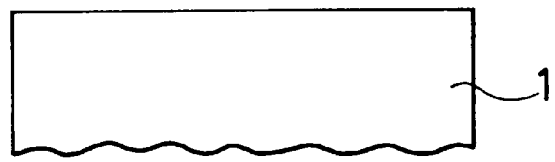
FIGS. 3A to 3D are schematic cross-sectional views showing a fabrication process sequence of a semiconductor device according to a first embodiment of the invention, respectively.
Figure 3B:
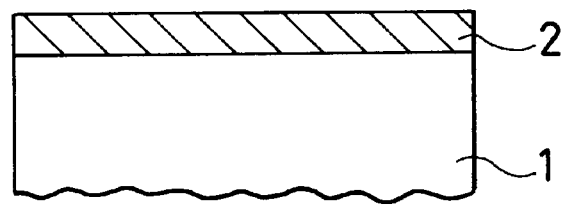

First, a single-crystal silicon substrate 1 as shown in FIG. 3A is prepared. Then, the substrate 1 is thermally oxidized to thereby produce a $SiO_2$ film 2 on a main surface of the substrate 1, as shown in FIG. 3B. The $SiO_2$ film 2 has a thickness of 4 nm. This process is realized, for example, by a heat-treatment in a dry oxygen atmosphere at a temperature of 900° C. for 100 seconds, in a dry oxygen atmosphere at a temperature of 1000° C. for 34 seconds using a rapid thermal processor (RTP), or in a water vapor (wet) atmosphere at a temperature of 750° C. for 6 minutes and 30 seconds using a vertical heat-resistance furnace.

This process may be performed by any process other than the thermal oxidation process if it can produce a $SiO_2$ film on the main surface of the substrate 1.

Figure 3C:
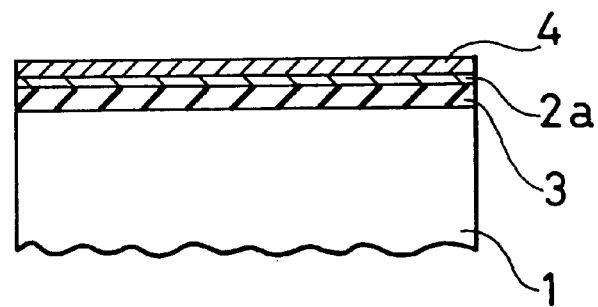

Next, the substrate 1 with the $SiO_2$ film 2 is subjected to a rapid thermal process in an $NH_3$ atmosphere at a temperature of 850° C. for 60 seconds, thereby nitriding the $SiO_2$ film 2. Nitrogen (N) is introduced into the surface area of the film 2 and the neighborhood of the interface of the substrate 1 with the film 2 during this process. Thus, a silicon oxynitride ($SiN_{3x/4}O_{2-x}$) film 3 is produced at the interface, where 0<x<2, and at the same time, another $SiN_{3x/4}O_{2-x}$ film 4 is produced in the surface area of the film 2, as shown in FIG. 3C. The reference numeral 2a indicates the remaining $SiO_2$ film.

The lower $SiN_{3x/4}O_{2-x}$ film 3 has a thickness of approximately 1 to 2 nm and a nitrogen concentration of approximately 2 to 3 atomic percents (at.%). The introduced nitrogen atoms into the film 3 are ordinarily and strongly bonded to the silicon and oxygen atoms. Therefore, this film 3 is stable and is difficult to be affected by a subsequent heat-treatment process.

The upper $SiN_{3x/4}O_{2-x}$ film 4 has a thickness of approximately 2 nm and a nitrogen concentration of approximately 4 at.%. The introduced nitrogen atoms into the film 4 are not ordinarily and strongly bonded to the silicon and oxygen atoms. Therefore, this film 4 is unstable and is easy to be affected by a subsequent heat-treatment process.

Finally, the substrate 1 with the $SiO_2$ film 2a and the $SiN_{3x/4}O_{2-x}$ films 3 and 4 is subjected to a rapid thermal process in an oxidizing atrmosphere at a temperature of 1150° C. for 120 seconds, thereby reoxidizing the substrate 1.

During this reoxidation process, a large part of the nitrogen atoms introduced into the upper $SiN_{3x/4}O_{2-x}$ film 4 are diffused away into the atmosphere. Therefore, it can be said that the upper $SiN_{3x/4}O_{2-x}$ film 4 disappears and the underlying $SiO_2$ film 2a grows to become an $SiO_2$ film 2b having a thickness of 6 nm. Consequently, the lower $SiN_{3x/4}O_{2-x}$ film 3 is raised by the height equal to the thickness of the $SiO_2$ film 5. The thickness and composition of the lower $SiN_{3x/4}O_{2-x}$ film 3 are kept substantially unchanged. A small part of the introduced nitrogen atoms are left after the above reoxidation process and as a result, the $SiO_2$ film 2b contains the nitrogen atoms.

Figure 3D:
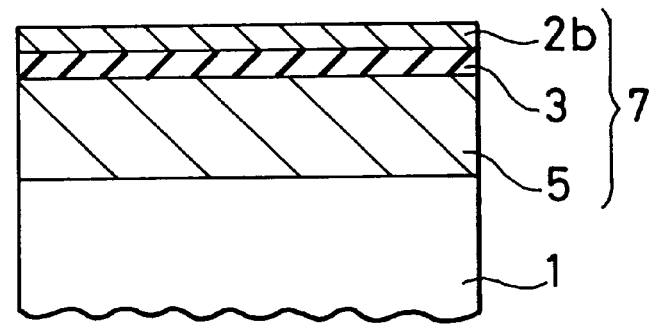

Thus, a three-level structured insulator 7 having a thickness of approximately 10 nm is produced on the main surface of the substrate 1, as shown in FIG. 3D. The insulator 7 is composed of the $SiO_2$ film 5 having a thickness of 6 nm in the bottom level, the $SiN_{3x/4}O_{2-x}$ film 3 having a thickness of approximately 2 nm in the middle level, and the nitrogen-rich $SiO_2$ film 2b having a thickness of approximately 2 nm in the top level.

The above reoxidation process may be performed by the same oxidation condition as that of the process forming the $SiO_2$ film 2.

With the fabrication method of a semiconductor device according to the first embodiment, since the lower $SiO_2$ film 5 is thicker than the $SiN_{3x/4}O_{2-x}$ film 3, the interface of the films 5 and 3 exists at a level higher than the central level of the insulator 7. In other words, the $SiN_{3x/4}O_{2-x}$ film 3 serving as a diffusion or penetration barrier is positioned near the upper, opposite side of the insulator 7 to the substrate 1.

Therefore, when a material doped with impurity atoms is contacted with the upper side of the insulator 7, the diffusion action of the impurity atoms are stopped by the film 3. This means that the introduction of the impurity atoms are limited within a small, top part of the insulator 7. As a result, the degradation in the property and/or electrical performance of the insulator 7 can be nearly avoided.

It is preferred that the above rapid thermal nitridation process is performed under the following condition:

The temperature-raising rate is in the range from 100° C./min to 150° C./sec. The temperature-lowering rate is in the range from 30° C./min to 100° C./sec. If the temperature raising and lowering rates are greater than their upper limits, the heat-treatment system tends to be badly affected and/or cracks tends to occur in the silicon substrate 1 due to rapid temperature change. If the temperature raising and lowering rates are less than their lower limits, some unwanted film tends to be produced during the oxidation/nitridation process switching and/or a desired throughput cannot be obtained.

To confirm the performance and composition of the semiconductor device fabricated by the method according to the first embodiment, the inventor carried out some tests, the results of which are shown in FIGS. 4, 5, 6 and 7.

In these tests, inventive semiconductor devices were fabricated by the method according to the first embodiment. At the same time, conventional semiconductor devices were fabricated by the above-described conventional method shown in FIGS. 2A to 2D. In the method of fabricating the conventional devices, the $SiO_2$ film 32 obtained by the thermal oxidation process had a thickness of 8 nm, the nitridation process was carried out in an $NH_3$ atmosphere at 850° C. for 60 seconds, and the reoxidation process was carried out in an oxidizing atmosphere at 1150° C. for 15 seconds.

FIG. 4 shows plots of the etching rate profiles of the insulator 7 and 37 as a function of their depth, which was obtained by using a water-diluted hydrogen fluoride (HF). The etching rate was normalized by the etching rate of a pure $SiO_2$ film.

In FIG. 4, the insulator 7 or 37 has the same etching rate as that of the pure $SiO_2$ film at the point where the normalized etching rate has a value of 1. This means that the composition of the insulator 7 or 37 is pure $SiO_2$ at this point or depth. On the other hand, if the insulator 7 or 37 has an etching rate lower than the value of 1, this means that the composition of the insulator 7 or 37 is nitrogen-containing $SiO_2$ or $SiN_x$ at this point or depth, because the etching rate of $SiN_x$ is typically less than that of $SiO_2$.

It is seen from FIG. 4 that the profile A of the inventive semiconductor device has a bottom near the surface of the insulator 7, and that the profile B of the conventional semiconductor device has a bottom near the depth of 8 nm. Accordingly, the region serving as the penetration barrier is located near the top of the insulator 7 in the inventive device. On the other hand, the region serving as the penetration barrier is located near the bottom of the insulator 37 in the conventional device.

Figure 5:
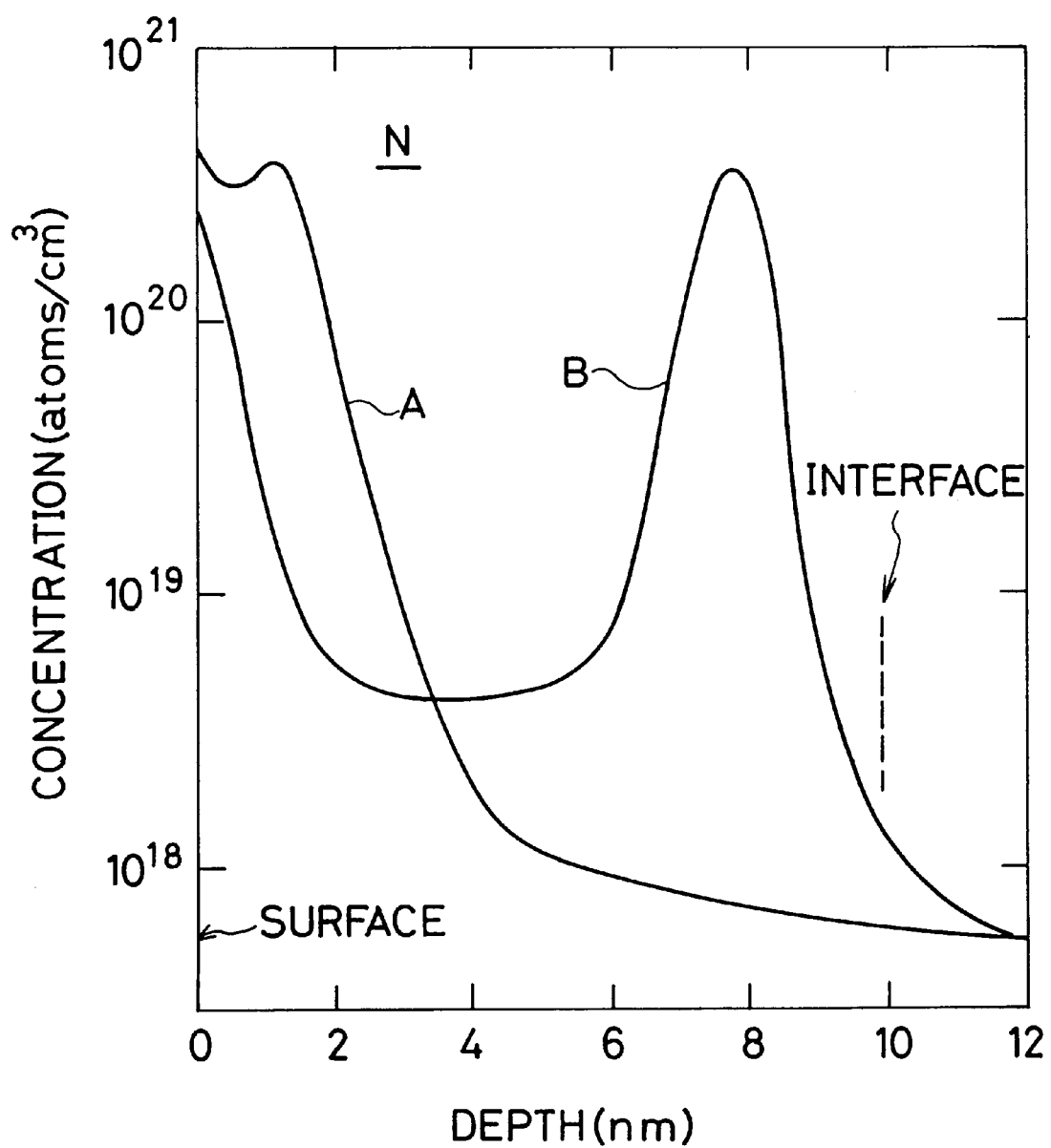
FIG. 5 is a graph showing the relationship between the nitrogen concentration and depth of the insulator in the semiconductor device according to the first embodiment.

FIG. 5 shows plots of the nitrogen concentration of the inventive and conventional insulators 7 and 37 as a function of its depth, which was obtained by the Secondary Ion Mass Spectrometry (SIMS).

It is seen from FIG. 5 that the profile A of the inventive insulator 7 has a peak near the top and that the profile B of the conventional insulator 37 has a peak at a depth of approximately 8 nm near the bottom. Thus, the compositional analysis results shown in FIG. 4 were confirmed by the SIMS method.

Figure 6:
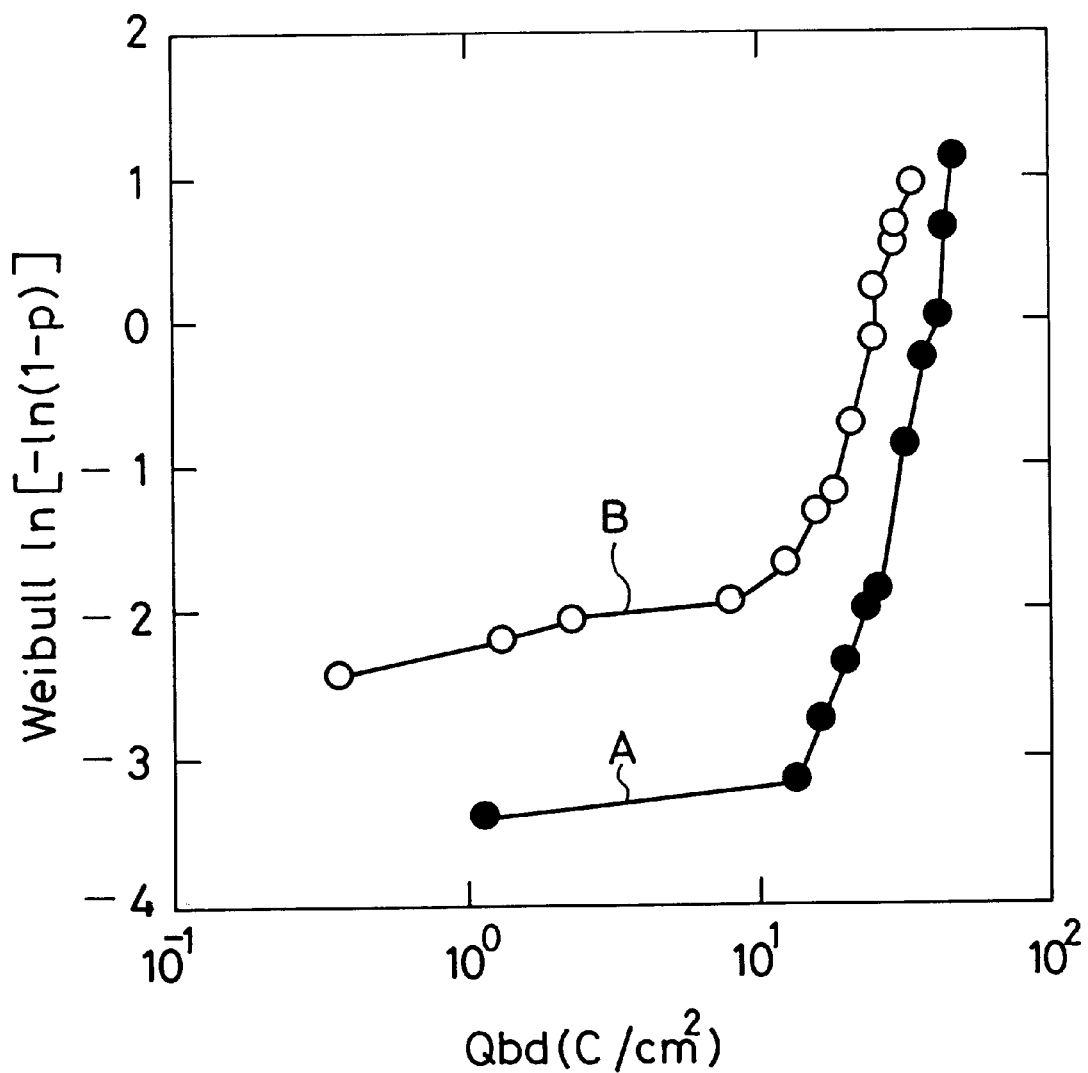
FIG. 6 is a graph showing the relationship between the cumulative failure and injected charge amount to breakdown of the insulator in the semiconductor device according to the first embodiment.

FIG. 6 shows plots A and B of the Weibull $\ln[-\ln(1-p)]$ (i.e., cumulative failure) of the inventive and conventional insulators 7 and 37 as a function of the charge-to-breakdown $Q_{bd}$, where p is a failure rate. This result was obtained by the Time-Dependent Dielectric Breakdown (TDDB) method in order to confirm the reliability of the insulators 7 and 37.

The larger the value of $Q_{bd}$ and the narrower the fluctuation thereof, the higher the reliability of the insulators 7 and 37 becomes.

It is seen from FIG. 6 that the inventive insulator 7 has larger values of $Q_{bd}$ than those of the conventional insulator 37 and that initial failure or breakdown is more difficult to occur for the inventive insulator 7 compared with the case of the conventional insulator 37. It is considered that this improvement was caused by the decrease of the impurity atoms diffused from the contacted material.

Figure 7:
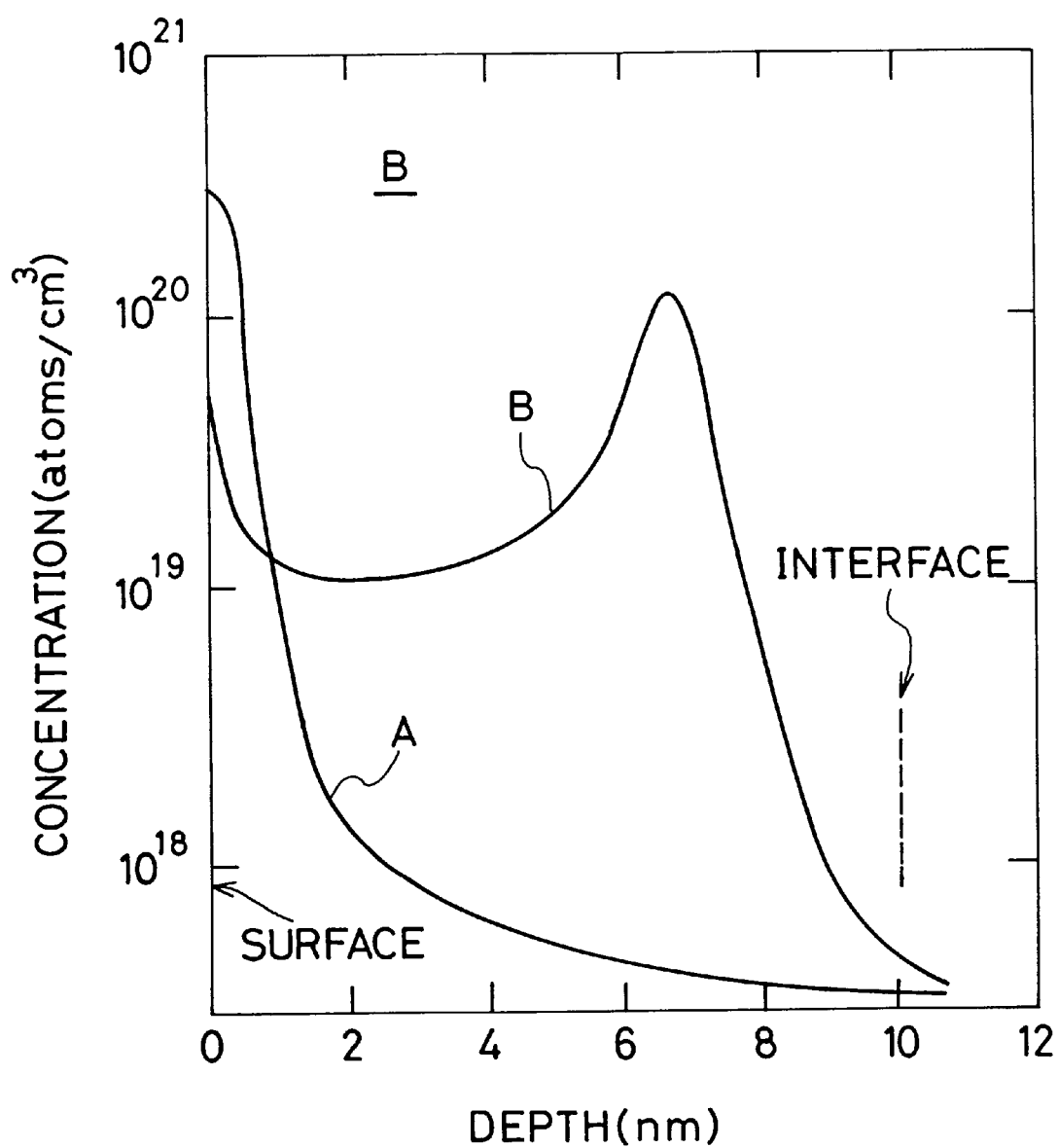
FIG. 7 is a graph showing the relationship between the boron concentration and depth of the insulator in the semiconductor device according to the first embodiment.

FIG. 7 shows plots of the boron concentration of the inventive and conventional insulators 7 and 37 as a function of its depth, which was obtained by a SIMS test. In this test, $p^+$-type polysilicon films doped with boron were contacted with the insulators 7 and 37 to confirm the penetration-barrier function or performance of the insulators 7 and 37.

It is seen from FIG. 7 that the plot A of the inventive insulator 7 has a peak near the top and that the plot B of the conventional insulator 37 has a peak at a depth of approximately 8 nm near the bottom. Comparing these plots with the plots in FIG. 5, it is understood that the diffusion of the boron atoms is stopped at the nitrogen-containing regions of the insulators 7 and 37, respectively. In other words, it is confirmed that the improvement in reliability and fabrication yield as shown in FIG. 6 was realized due to the fact that the doped boron atoms are effectively restrained from diffusing into the inside of the inventive insulator 7.

SECOND EMBODIMENT

A fabrication method of a semiconductor device according to a second embodiment of the invention is shown in FIGS. 8A to 8D.

Figure 8A:
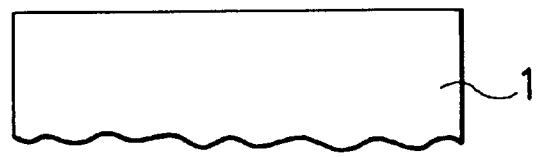
FIGS. 8A to 8D are schematic cross-sectional views showing a fabrication process sequence of a semiconductor device according to a second embodiment of the invention, respectively.
Figure 8B:
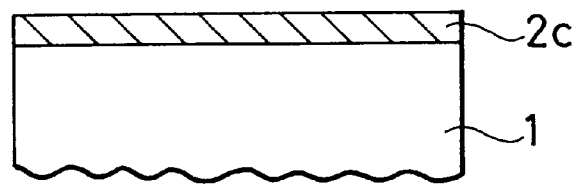

First, a single-crystal silicon substrate 1 as shown in FIG. 8A is prepared. Then, the substrate 1 is thermally oxidized to thereby produce a $SiO_2$ film 2c on a main surface of the substrate 1, as shown in FIG. 8B. These process steps are the same as those in the first embodiment. However, the $SiO_2$ film 2c has a thickness of 2 nm, which is smaller than the $SiO_2$ film 2 in the first embodiment.

This process is realized, for example, by a heat-treatment in a dry oxygen atmosphere at a temperature of 900° C. for 25 seconds, in a dry oxygen atmosphere at a temperature of 1000° C. for 8 seconds using a rapid thermal processor, or in a water vapor atmosphere at a temperature of 750° C. for 30 seconds using a vertical heat-resistance furnace.

This process may be performed by any process other than the thermal oxidation process if it can produce a $SiO_2$ film on the main surface of the substrate 1.

Figure 8C:
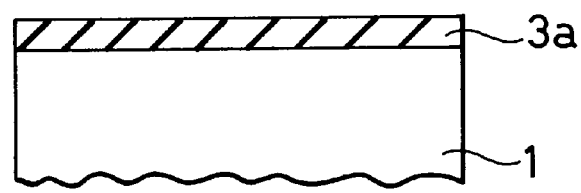

Next, the substrate 1 with the $SiO_2$ film 2c is subjected to a rapid thermal process under the same condition as that of the first embodiment, thereby nitriding the $SiO_2$ film 2c. The thickness of the film 2c is sufficiently small and therefore, nitrogen is introduced into the entire film 2c during this process. Thus, the film 2c is converted to a $SiN_{3x/4}O_{2-x}$ film 3a, which is formed at the interface of the substrate 1 with the film 2c, as shown in FIG. 8C.

The $SiN_{3x/4}O_{2-x}$ film 3a has a thickness of approximately 2 nm and a nitrogen concentration of approximately 2 to 3 at.%. The introduced nitrogen atoms into the film 3a are ordinarily and strongly bonded to the silicon and oxygen atoms. Therefore, this film 3a is stable and is difficult to be affected by a subsequent heat-treatment process.

Finally, the substrate 1 with the $SiN_{3x/4}O_{2-x}$ film 3a is subjected to a rapid thermal process under the same condition as that of the first embodiment, thereby reoxidizing the substrate 1.

During this reoxidation process, an $SiO_2$ film 5a having a thickness of 6 nm is produced at the interface of the substrate 1 with the $SiN_{3x/4}O_{2-x}$ film 3a. Consequently, the $SiN_{3x/4}O_{2-x}$ film 3a is raised by the height equal to the thickness of the $SiO_2$ film 5a. The thickness and composition of the $SiN_{3x/4}O_{2-x}$ film 3a are kept substantially unchanged.

Figure 8D:
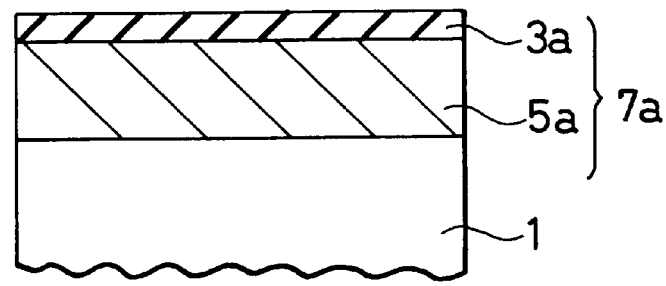

Thus, a two-level structured insulator 7a having a thickness of approximately 8 nm is produced on the main surface of the substrate 1, as shown in FIG. 8D. The insulator 7a is composed of the $SiO_2$ film 5a having a thickness of 6 nm in an upper level and the $SiN_{3x/4}O_{2-x}$ film 3a having a thickness of approximately 2 nm in a lower level.

With the fabrication method of a semiconductor device according to the second embodiment, since the $SiN_{3x/4}O_{2-x}$ film 3a serving as the diffusion barrier is located at the top of the insulator 7a, in other words, it is positioned near the upper, opposite side of the insulator 7a to the substrate 1. Therefore, when a material doped with impurity atoms is contacted with the upper side of the insulator 7a, the diffusion action of the impurity atoms are completely stopped by the film 3a.

As a result, the degradation in the property and/or electrical performance of the insulator 7a can be completely avoided, enabling the extreme improvement in reliability and fabrication yield of the semiconductor device.

THIRD EMBODIMENT

A fabrication method of a semiconductor device according to a third embodiment of the invention is shown in FIGS.

9A to 9C. This embodiment does not include the thermal oxidation process as shown in the above first and second embodiments.

Figure 9A:
FIGS. 9A to 9C are schematic cross-sectional views showing a fabrication process sequence of a semiconductor device according to a third embodiment of the invention, respectively.
Figure 9B:
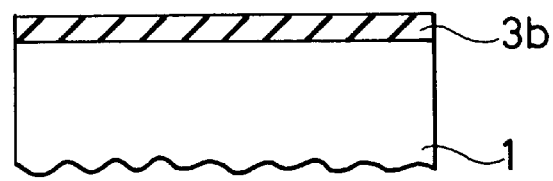

After a single-crystal silicon substrate 1 as shown in FIG. 9A is prepared, the substrate 1 having no $SiO_2$ film is subjected to a rapid thermal process under the same condition as that of the first embodiment, thereby nitriding the substrate 1. Thus, a $SiN_x$ film 3b is formed on the main surface of the substrate 1, as shown in FIG. 9B.

The $SiN_x$ film 3b has a thickness of approximately 2 nm and a nitrogen concentration of approximately 10 to 30 at.%. This film 3b is stable and is difficult to be affected by a subsequent heat-treatment process.

Finally, the substrate 1 with the $SiN_x$ film 3b is subjected to a rapid thermal process under the same condition as that of the first embodiment, thereby reoxidizing the substrate 1.

During this reoxidation process, an $SiO_2$ film 5b having a thickness of 6 nm is produced at the interface of the substrate 1 with the $SiN_x$ film 3b. Consequently, the $SiN_x$ film 3 is raised by the height equal to the thickness of the $SiO_2$ film 5. The thickness and composition of the $SiN_x$ film 3b are kept substantially unchanged.

A small amount of oxygen may be introduced into the film 3b, because the entire surface of the film 3b is exposed to the oxidizing atmosphere throughout this process.

Figure 9C:
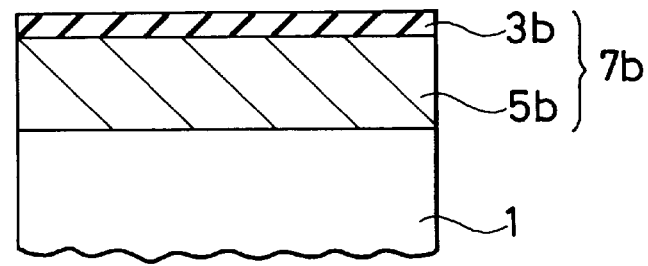

Thus, a two-level structured insulator 7b having a thickness of approximately 8 nm is produced at the interface of the substrate 1, as shown in FIG. 9C. The insulator 7b is composed of the $SiO_2$ film 5b having a thickness of 6 nm in a lower level and the oxygen-containing $SiN_x$ film 3b having a thickness of approximately 2 nm in an upper level.

With the fabrication method of a semiconductor device according to the third embodiment, the oxygen-containing $SiN_x$ film 3b serving as the diffusion barrier is located at the top of the insulator 7b. Therefore, when a material doped with impurity atoms is contacted with the upper side of the insulator 7b, the diffusion action of the impurity atoms are completely stopped by the film 3b. As a result, the degradation in the property and/or electrical performance of the insulator 7b can be completely avoided, enabling the extreme improvement in reliability and fabrication yield of the semiconductor device.

FOURTH EMBODIMENT

A fabrication method of a semiconductor device according to a fourth embodiment of the invention is shown in FIGS. 10A to 10E.

In the above first and second embodiments, a thin $SiO_2$ film is formed on the main surface of the substrate 1 during the first process step. However, a thick $SiO_2$ film may be formed if it is etched to have a specified thickness in a subsequent process step in the present invention.

Figure 10A:
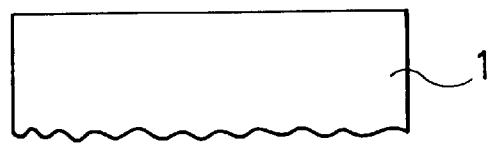
Figs. 10A to 10E are schematic cross-sectional views showing a fabrication process sequence of a semiconductor device according to a fourth embodiment of the invention, respectively.
Figure 10B:
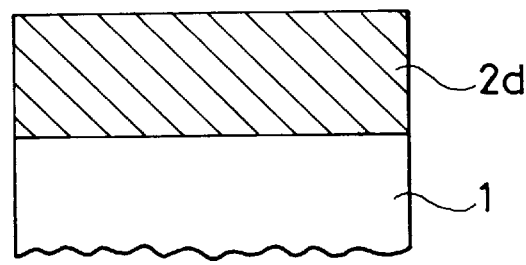

First, a single-crystal silicon substrate 1 as shown in FIG. 10A is prepared and then, the substrate 1 is thermally oxidized to thereby produce a thick $SiO_2$ film 2d on a main surface of the substrate 1, as shown in FIG. 10B. The $SiO_2$ film 2d has, for example, a thickness of 10 nm.

This process is realized, for example, by a heat-treatment in a dry oxygen atmosphere at a temperature of 1000° C. for 220 seconds, in a dry oxygen atmosphere at a temperature of 1100° C. for 52 seconds using a rapid thermal processor, or in a water vapor atmosphere at a temperature of 750° C. for 36 minutes using a vertical heat-resistance furnace.

This process may be performed by any process other than the thermal oxidation process if it can produce a $SiO_2$ film on the main surface of the substrate 1.

Figure 10C:
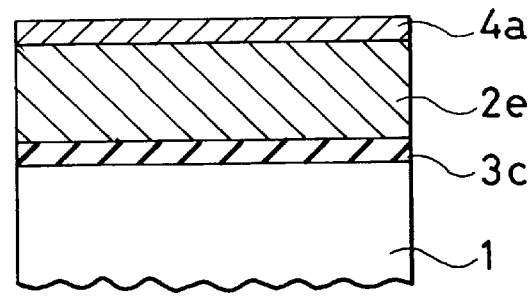

Next, the substrate 1 with the thick $SiO_2$ film 2d is subjected to a rapid thermal process under the same condition as that of the first embodiment, thereby nitriding the $SiO_2$ film 2d. Nitrogen is introduced into the surface area of the film 2d and the neighborhood of the interface of the substrate 1 during this process. Thus, a $SiN_{3x/4}O_{2-x}$ film 3c is produced at the interface and at the same time, another $SiN_{3x/4}O_{2-x}$ film 4a is produced in the surface area of the film 2d, as shown in FIG. 10C. The reference numeral 2e indicates the remaining $SiO_2$ film.

The lower $SiN_{3x/4}O_{2-x}$ film 3c has a thickness of approximately 2 nm and a nitrogen concentration of approximately 2 to 3 at.%. The introduced nitrogen atoms into the film 3c are ordinarily and strongly bonded to the silicon and oxygen atoms. Therefore, this film 3c is stable and is difficult to be affected by a subsequent heat-treatment process.

The upper $SiN_{3x/4}O_{2-x}$ film 4a has a thickness of approximately 1 to 2 nm and a nitrogen concentration of approximately 4 at.%. The introduced nitrogen atoms into the film 4a are not ordinarily and strongly bonded to the silicon and oxygen atoms. Therefore, this film 4a is unstable and is easy to be affected by a subsequent heat-treatment process.

Subsequently, the substrate 1 with the $SiO_2$ film 2e and the $SiN_{3x/4}O_{2-x}$ films 3c and 4a is subjected to a rapid thermal process in an oxidizing atmosphere at a temperature of 1150° C. for 120 seconds, thereby reoxidizing the substrate 1. During this reoxidation process, a $SiO_2$ film 5c is produced at the interface of the substrate 1 with the lower $SiN_{3x/4}O_{2-x}$ film 3c. Consequently, the $SiN_{3x/4}O_{2-x}$ film 3c is raised by the height equal to the thickness of the $SiO_2$ film 5c, as shown in FIG. 10C. The thickness and composition of the lower $SiN_{3x/4}O_{2-x}$ film 3c are kept substantially unchanged.

A small part of the introduced nitrogen atoms are left after this reoxidation process and as a result, the $SiO_2$ film 2f contains the nitrogen atoms.

Simultaneously with the formation of the $SiO_2$ film 5c, a large part of the nitrogen atoms introduced into the upper $SiN_{3x/4}O_{2-x}$ film 4a are diffused away into the atmosphere. Therefore, it can be said that the upper $SiN_{3x/4}O_{2-x}$ film 4a disappears and the underlying $SiO_2$ film 2e grows to become an $SiO_2$ film 2f having a thickness of approximately 6 nm.

The above reoxidation process may be performed by the same oxidation condition as that of the thermal oxidation process forming the $SiO_2$ film 2d.

Figure 10D:
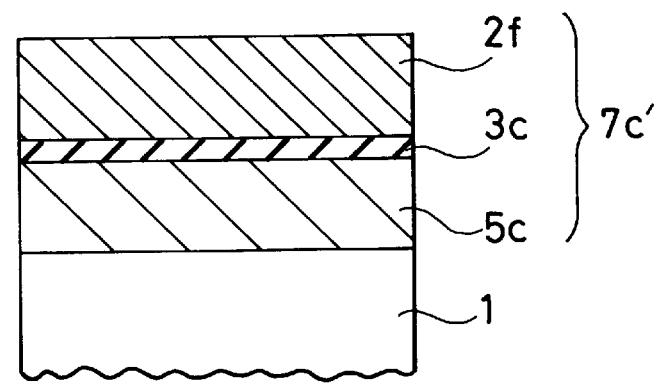

Thus, a three-level structured insulator 7c' having a thickness of approximately 17 nm is produced on the main surface of the substrate 1, as shown in FIG. 10D.

Figure 10E:
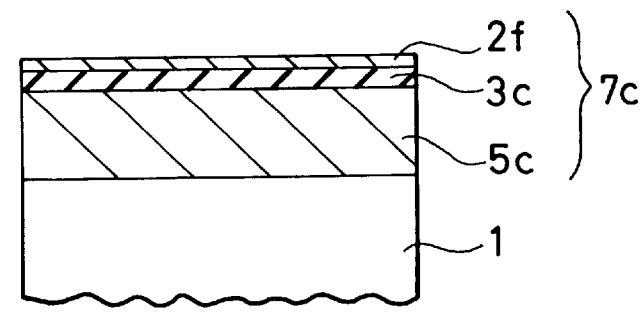

Finally, the $SiO_2$ film 2f located at the top of the insulator 7c' is partially etched until the insulator 7c' has a thickness of approximately 10 nm, thereby producing a three-level insulator 7c, as shown in FIG. 10E.

The insulator 7c is composed of the $SiO_2$ film 5c having a thickness of 6 nm in the bottom level, the $SiN_{3x/4}O_{2-x}$ film 3c having a thickness of approximately 2 nm in the middle level, and the nitrogen-rich $SiO_2$ film 2f having a thickness of approximately 2 nm in the top level.

The above etching process is, for example, carried out by dipping the substrate 1 with the insulator 7c' into a water solution of HF for 30 seconds to 6 minutes. This HF solution is obtained, for example, by mixing a 50%-HF solution with water at a ratio of 1:400.

A water solution of $NH_4F$ may be used instead of the HF solution.

Further, a HF-system etching gas may be used to perform the etching process. For example, a mixture of a HF vapor made from a liquified fluoride (F) gas and a diluted $N_2$ gas may be used. In this case, the etching time is, for example, 20 seconds to 2 minutes.

Thus, any HF-system etching solution or gas is preferably used, because this solution or gas provides an extremely large etching selectivity between $SiO_2$ and $SiN_x$ or $SiN_{3x/4}O_{2-x}$ and as a result, overetching is ensured to be prevented.

With the fabrication method of a semiconductor device according to the fourth embodiment, since the lower $SiO_2$ film 5c is thicker than the $SiN_{3x/4}O_{2-x}$ film 3c, the interface of the films 5c and 3c exists at a level higher than the central level of the insulator 7c. In other words, the $SiN_{3x/4}O_{2-x}$ film 3c serving as a diffusion or penetration barrier is positioned near the upper, opposite side of the insulator 7c to the substrate 1.

Therefore, when a material doped with impurity atoms is contacted with the upper side of the insulator 7c, the diffusion action of the impurity atoms are stopped by the film 3c. This means that the introduction of the impurity atoms are limited within a small, top part of the insulator 7c. As a result, the degradation in the property and/or electrical performance of the insulator 7c can be nearly avoided.

FIFTH EMBODIMENT

Figure 1:
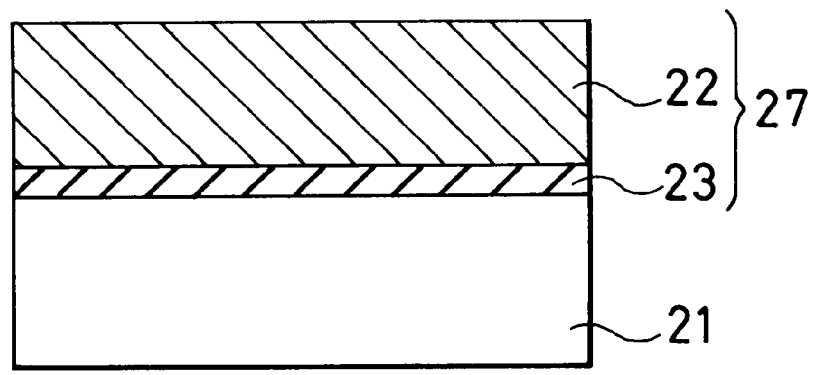
FIG. 1 is a schematic cross-sectional view of a conventional semiconductor device.
Figure 11:
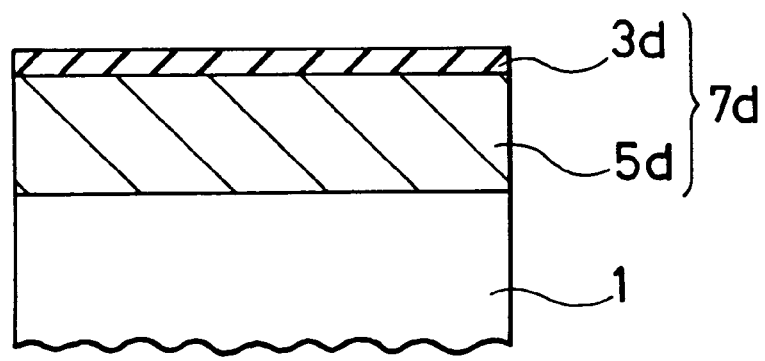
FIG. 11 is a schematic cross-sectional view of a semiconductor device fabricated by a method according to a fifth embodiment of the invention.
Figure 2A:
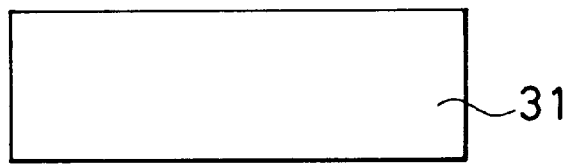
FIGS. 2A to 2D are schematic cross-sectional views showing a fabrication process sequence of another conventional semiconductor device, respectively.
Figure 2B:
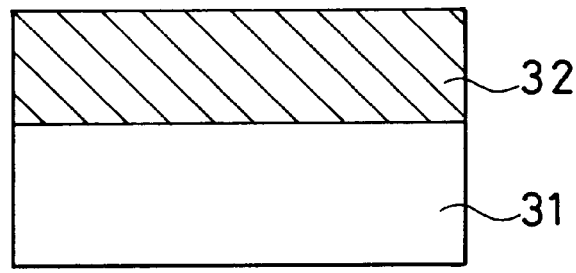
Figure 2C:
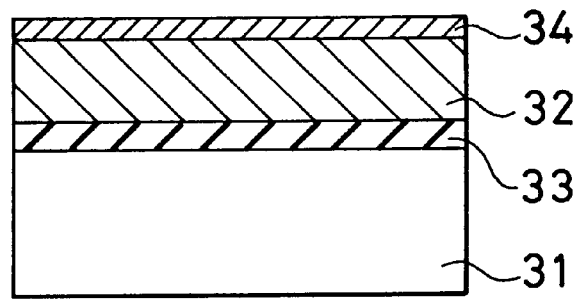
Figure 2D:
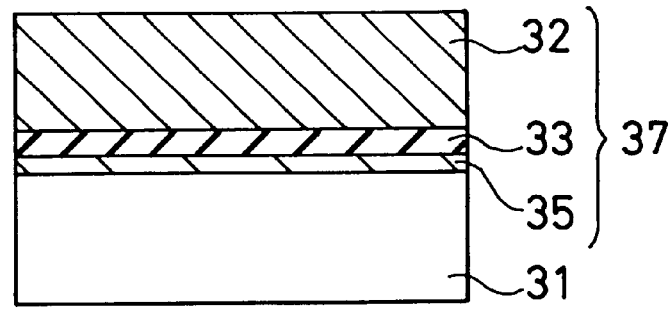

A semiconductor device fabricated by a method according to a fifth embodiment of the invention is shown in FIG. 11. This device has the same structure as that of the fourth embodiment shown in FIG. 10E excepting that the unetched $SiO_2$ film 2f located in the top level of the insulator 7c is removed.

The method according to the fifth embodiment contains the same process steps as those of the fourth embodiment shown in FIGS. 10A to 10D. However, the final etching process is different from that of the fourth embodiment. Specifically, the $SiO_2$ film 2f located in the top level of the insulator 7c' is entirely removed to thereby expose the underlying $SiN_{3x/4}O_{2-x}$ film 3c.

Thus, an insulator 7d having the two-level structure is obtained, as shown in FIG. 11. The insulator 7d is composed of the $SiO_2$ film 5d having a thickness of 6 nm in the bottom level and the $SiN_{3x/4}O_{2-x}$ film 3d having a thickness of approximately 2 nm in the top level.

Since the $SiN_{3x/4}O_{2-x}$ film 3d serves as a good etching stop during the etching process, no overetching will take place, preventing the unwanted thickness reduction of the insulator 7d.

Although a silicon substrate is used in the above first to fifth embodiments, a substrate made of any other semiconductor may be used.

With the fabrication method according to the fifth embodiment, the same advantages as those in the second and third embodiments can be obtained.

The thickness of the respective films constituting the insulator is not limited to that shown in the above embodiments and it may be optionally changed as desired.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A fabrication method of a semiconductor device comprising the steps of:
   (a) forming a first dielectric film on a semiconductor substrate, said first dielectric film being made of an oxide of a semiconductor constituting said substrate;
   (b) performing a first heat-treatment on said substrate with said first dielectric film in a nitriding atmosphere to nitride said first dielectric film, thereby producing a second dielectric film at an interface of said substrate with said first dielectric film, said second dielectric film being made of an oxynitride of said semiconductor constituting said substrate, and said entire first dielectric film being nitrided to become said second dielectric film; and
   (c) performing a second heat-treatment on said substrate with said second dielectric film in an oxidizing atmosphere to oxide said substrate, thereby producing a third dielectric film at an interface of said substrate with said second dielectric film, said third dielectric film being made of an oxide of said semiconductor constituting said substrate;
   wherein said second and third dielectric films constitute a two-level structured insulator with said second dielectric film disposed over said third dielectric film;
   and wherein said third dielectric film is thicker than said second dielectric film so that an interface of said third and second dielectric films exists at a level higher than the central level of said insulator.

2. The method according to claim 1, wherein said step (a) is performed by a thermal oxidation of said substrate in an oxidizing atmosphere to obtain the thickness of said first dielectric film of 2.5 nm or less.

3. The method of claim 2, wherein a total thickness of said second and third dielectric films is 8 nm or less.

4. A fabrication method of a semiconductor device comprising the steps of:
   (a) forming a first dielectric film on a semiconductor substrate, said first dielectric film being made of an oxide of a semiconductor constituting said substrate;
   (b) performing a first heat-treatment on said substrate with said first dielectric film in a nitriding atmosphere to nitride said first dielectric film, thereby producing a second dielectric film at an interface of said substrate with said first dielectric film, said second dielectric film being made of an oxynitride of said semiconductor constituting said substrate; and
   (c) performing a second heat-treatment on said substrate with said first and second dielectric films in an oxidizing atmosphere to oxide said substrate, thereby producing a third dielectric film at an interface of said substrate with said second dielectric film, said third dielectric film being made of an oxide of said semiconductor constituting said substrate;
   wherein said first, second and third dielectric films constitute a three-level structured insulator with said first dielectric film disposed over said second dielectric film which is, in turn, disposed over said third dielectric film;
   and wherein said third dielectric film is thicker than said second dielectric film so that an interface of said third and second dielectric films exists at a level higher than the central level of said insulator.

5. The method according to claim 4, wherein said step (a) is performed by a thermal oxidation of said substrate in an oxidizing atmosphere to obtain the thickness of said first dielectric film of 5 nm or less.

6. The method of claim 5, wherein a total thickness of said first, second and third dielectric films is 10 nm or less.

7. A fabrication method of a semiconductor device comprising the steps of:
   (a) performing a first heat-treatment on a semiconductor substrate in a nitriding atmosphere to nitride said substrate, thereby producing a first dielectric film on a surface of said substrate, said first dielectric film being made of a nitride of a semiconductor constituting said substrate; and (b) performing a second heat-treatment on said semiconductor substrate with said first dielectric film in an oxidizing atmosphere to oxide said substrate, thereby producing a second dielectric film at an interface of said substrate with said first dielectric film, said second dielectric film being made of an oxide of said semiconductor constituting said substrate;

wherein said first and second dielectric films constitute a two-level structured insulator with said first dielectric film disposed over said second dielectric film;

and wherein said second dielectric film is thicker than said first dielectric film so that an interface of said second and first dielectric films exists at a level higher than the central level of said insulator.

8. A fabrication method of a semiconductor device comprising the steps of:

(a) forming a first dielectric film on a semiconductor substrate, said first dielectric film being made of an oxide of a semiconductor constituting said substrate;

(b) performing a first heat-treatment on said substrate with said first dielectric film in a nitriding atmosphere to nitride said first dielectric film, thereby producing a second dielectric film at an interface of said substrate with said first dielectric film, said second dielectric film being made of an oxynitride of said semiconductor constituting said substrate;

(c) performing a second heat-treatment on said substrate with said first and second dielectric films in an oxidizing atmosphere to oxide said substrate, thereby producing a third dielectric film at an interface of said substrate with said second dielectric film, said third dielectric film being made of an oxide of said semiconductor constituting said substrate; and (d) etching an opposite side of said first dielectric film to said substrate until the thickness of said first dielectric film is approximately 2 nm;

wherein said first, second and third dielectric films constitute a three-level structured insulator;

and wherein said third dielectric film is thicker than said second dielectric film so that an interface of said third and second dielectric films exists at a level higher than the central level of said insulator.

9. A fabrication method of a semiconductor device comprising the steps of:

(a) forming a first dielectric film on a semiconductor substrate, said first dielectric film being made of an oxide of a semiconductor constituting said substrate;

(b) performing a first heat-treatment on said substrate with said first dielectric film in a nitriding atmosphere to nitride said first dielectric film, thereby producing a second dielectric film at an interface of said substrate with said first dielectric film, said second dielectric film being made of an oxynitride of said semiconductor constituting said substrate;

(c) performing a second heat-treatment on said substrate with said first and second dielectric films in an oxidizing atmosphere to oxide said substrate, thereby producing a third dielectric film at an interface of said substrate with said second dielectric film, said third dielectric film being made of an oxide of said semiconductor constituting said substrate; and (d) etching an opposite side of said first dielectric film to said substrate until said second dielectric film is exposed;

wherein said second and third dielectric films constitute a two-level structured insulator;

and wherein said third dielectric film is thicker than said second dielectric film so that an interface of said third and second dielectric films exists at a level higher than the central level of said insulator.

* * * * *